(12) United States Patent
Abdelfattah Aly et al.

(10) Patent No.: US 11,374,542 B2
(45) Date of Patent: Jun. 28, 2022

(54) ENHANCING SPEAKER PROTECTION ACCURACY

(71) Applicant: QUALCOMM Incorporated, San Diego, CA (US)

(72) Inventors: Khaled Mahmoud Abdelfattah Aly, Irvine, CA (US); Sherif Galal, Irvine, CA (US); Xin Fan, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 97 days.

(21) Appl. No.: 16/799,415

(22) Filed: Feb. 24, 2020

(65) Prior Publication Data

US 2021/0265958 A1   Aug. 26, 2021

(51) Int. Cl.
*H03F 3/45*  (2006.01)
*H03F 3/183*  (2006.01)
*H04R 3/00*  (2006.01)

(52) U.S. Cl.
CPC ......... *H03F 3/183* (2013.01); *H03F 3/45475* (2013.01); *H04R 3/00* (2013.01); *H03F 2200/03* (2013.01); *H03F 2200/129* (2013.01); *H03F 2203/45116* (2013.01); *H03F 2203/45528* (2013.01); *H03F 2203/45594* (2013.01)

(58) Field of Classification Search
CPC ..... H03F 1/02; H03F 3/45; H03F 3/68; H03F 3/005
USPC ........................... 330/9, 69, 124 R, 295, 310
See application file for complete search history.

(56) References Cited

U.S. PATENT DOCUMENTS

2006/0197593 A1\*  9/2006  Chang .................... H03F 1/3223
330/109
2012/0249242 A1\*  10/2012  Goldfarb ............... H03F 3/3028
330/253

\* cited by examiner

*Primary Examiner* — Khanh V Nguyen
(74) *Attorney, Agent, or Firm* — Patterson & Sheridan, LLP

(57) ABSTRACT

Certain aspects of the present disclosure are generally directed to circuitry and techniques for current sensing. For example, certain aspects provide a circuit for signal amplification including a first amplifier, a second amplifier, and a third amplifier. The circuit also includes a first capacitive element coupled between a first output of the first amplifier and a first input of the third amplifier, a second capacitive element coupled between a second output of the first amplifier and a second input of the third amplifier, a third capacitive element coupled between a first output of the second amplifier and the first input of the third amplifier, and a fourth capacitive element coupled between a second output of the second amplifier and the second input of the third amplifier.

20 Claims, 6 Drawing Sheets

ENHANCING SPEAKER PROTECTION ACCURACY

FIELD

The present disclosure relates to audio signal processing, and more specifically, to circuitry for current sensing.

BACKGROUND

A speaker is a transducer that produces a pressure wave in response to an input electrical signal, and thus, sound is generated. The speaker input signal may be produced by an audio amplifier that receives a relatively lower voltage analog audio signal and generates an amplified signal (with a relatively higher voltage) to drive the speaker. A dynamic loudspeaker is typically composed of a lightweight diaphragm (a cone) connected to a rigid basket (a frame) via a flexible suspension (often referred to as a spider) that constrains a voice coil to move axially through a cylindrical magnetic gap. When the input electrical signal is applied to the voice coil, a magnetic field is created by the electric current in the coil, thereby forming a linear electric motor. By varying the electrical signal from the audio amplifier, the mechanical force generated by the interaction between the magnet and the voice coil is modulated and causes the cone to move back and forth, thereby creating the pressure waves interpreted as sound.

SUMMARY

Certain aspects of the present disclosure are generally directed to circuitry and techniques for current sensing (e.g., sensing current to a speaker in an audio application).

Certain aspects of the present disclosure are directed to a circuit for signal amplification. The circuit generally includes: a first amplifier; a second amplifier; a third amplifier; a first capacitive element coupled between a first output of the first amplifier and a first input of the third amplifier; a second capacitive element coupled between a second output of the first amplifier and a second input of the third amplifier; a third capacitive element coupled between a first output of the second amplifier and the first input of the third amplifier; and a fourth capacitive element coupled between a second output of the second amplifier and the second input of the third amplifier.

Certain aspects of the present disclosure are directed to a method for signal amplification. The method generally includes amplifying a first input signal using a first amplifier; amplifying a second input signal using a second amplifier; summing outputs of the first amplifier and the second amplifier via a summing stage, the summing comprising: a first capacitive element between a first output of the first amplifier and a first input of a third amplifier; a second capacitive element between a second output of the first amplifier and a second input of the third amplifier; a third capacitive element between a first output of the second amplifier and the first input of the third amplifier; and a fourth capacitive element between a second output of the second amplifier and the second input of the third amplifier; and amplifying an output signal of the summing stage using the third amplifier.

Certain aspects of the present disclosure are directed to an apparatus for signal amplification. The apparatus generally includes a first means for amplifying of a first input signal; a second means for amplifying of a second input signal; a summing stage configured to sum outputs of the first means for amplifying and the second means for amplifying, the summing stage comprising: a first capacitive element between a first output of the first amplifier and a first input of a third amplifier; a second capacitive element between a second output of the first amplifier and a second input of the third amplifier; a third capacitive element between a first output of the second amplifier and the first input of the third amplifier; and a fourth capacitive element between a second output of the second amplifier and the second input of the third amplifier; and a third means for amplifying an output signal of the summing stage using the third amplifier.

DETAILED DESCRIPTION

Certain aspects of the present disclosure are generally directed to circuitry and techniques for current sensing. For example, drive current for a speaker may be sensed for temperature control. Certain aspects provide sampling networks that improve the accuracy of the current sensing, as described in more detail herein.

Figure 1:
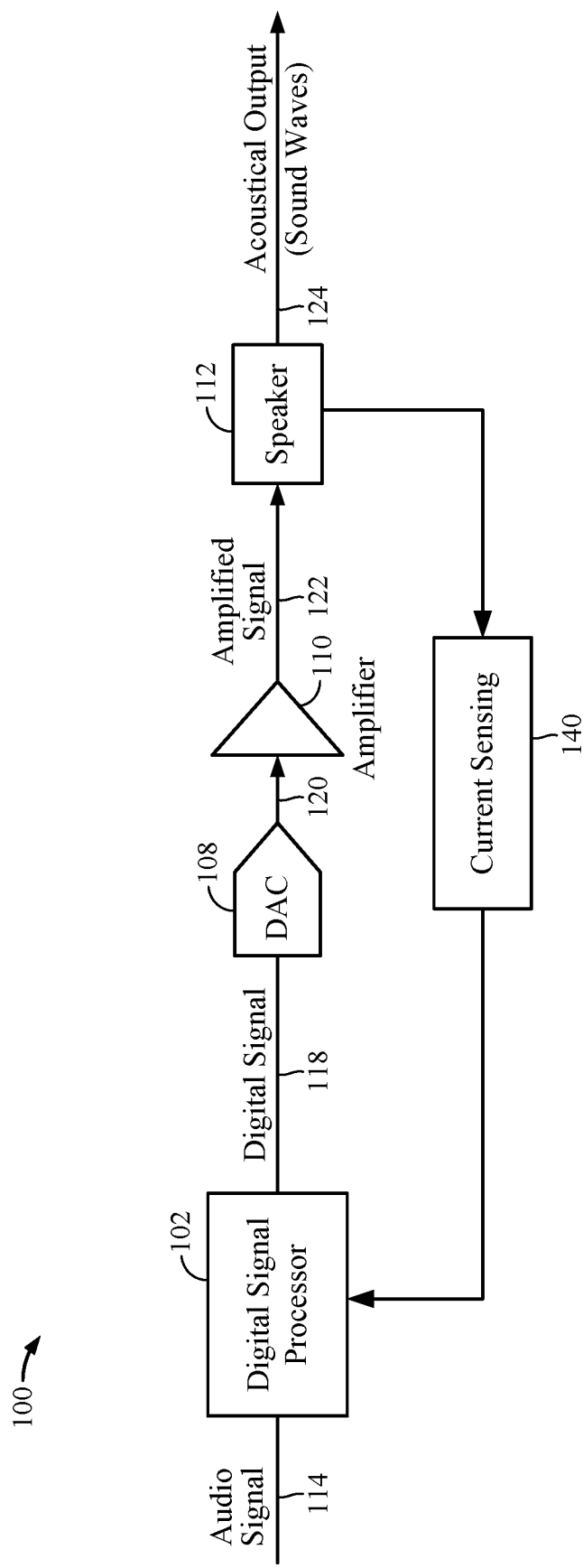
FIG. 1 illustrates an example audio amplifier system, in accordance with certain aspects of the present disclosure.

FIG. 1 illustrates an example audio amplifier system 100, in accordance with certain aspects of the present disclosure. As illustrated, a digital signal processor (DSP) 102 may receive and process audio signals 114 (e.g., a digital audio signal) by applying a digital filter aimed at increasing audio quality. The filtered digital signal 118 produced by the DSP (or a further processed version thereof) may be converted to an analog signal 120 using a digital-to-analog converter (DAC) 108. In certain aspects, the DAC may be implemented as part of the DSP 102 or an amplifier 110. In certain aspects, the analog signal 120 may be amplified using the amplifier 110 to generate the amplified signal 122. The amplified signal 122 may drive a speaker 112 to produce an acoustic output (e.g., sound waves) 124.

High output volume in mobile devices is becoming more and more important in next-generation mobile devices. Higher volume directly translates to higher output power. The higher volumes may be difficult to achieve with the relatively low voltages provided by lithium-ion batteries. Therefore, on-chip boost switchers may be used to boost the battery voltage to a higher level that supplies the speaker power amplifier (e.g., amplifier 110). The amplifier 110 may be implemented as a class-D amplifier due to the high power efficiency associated with class-D amplifiers. The efficiency of the class-D amplifier may be further improved by implementing the class-D amplifier in an H-bridge configuration.

In certain aspects, a current-voltage (IV)-sense path may be used to sense the speaker current and voltage and provide an estimate of the speaker resistance, which in turn may be used to predict the temperature of the speaker coil. For example, current-sensing circuitry 140 may be used to sense a drive current for the speaker 112, and provide a digital representation of the current to the DSP 102.

Speaker power efficiency may be improved by implementing a boost output via a class-G or class-H amplifier. As a result, an H-bridge amplifier may have a large audio common-mode (CM) signal. This CM signal may lead to CM-to-differential-mode (DM) conversion. The CM-DM conversion may reduce the accuracy of predicting the temperature of the speaker coil, which may lead to damage to the speaker. CM-to-DM conversion may adversely impact total harmonic distortion (THD) of the current-sensing output. THD is a measure of the harmonic distortion present in a signal and is defined as the ratio of the sum of the powers of all harmonic components to the power of the fundamental frequency of the signal. Certain aspects of the present disclosure are directed to circuits and techniques for eliminating (or at least reducing) the effect of CM-to-DM conversion in the IV-sense path.

FIGS. 2A, 2B, 2C, and 2D illustrate example implementations of current-sensing circuitry 200 (e.g., corresponding to the current-sensing circuitry 140), in accordance with certain aspects of the present disclosure. As illustrated, an H-bridge amplifier 202 (e.g., corresponding to the amplifier 110) may be used to drive a speaker, represented by the resistive element 281 (e.g., an 8Ω speaker). As illustrated, the amplifier 202 includes switches 204, 206, 208, 210 and current-sensing resistive elements 212, 214 coupled in series with respective switches 204, 210. The voltage across the current-sensing resistive elements 212, 214 may be sensed by respective amplifiers 216, 218 (e.g., implemented as differential amplifiers), the sensed voltages representing the drive current of the speaker.

The output nodes A, B, C, and D of the amplifiers 216, 218 may be coupled to a summing stage 298 implemented using capacitive elements 220, 222, 224, 226. The summing stage may be coupled between the output nodes of the amplifiers 216, 218 and inputs of an amplification stage 233 implemented using an amplifier 228. The summing stage may sum the signals at nodes A and C via the capacitive elements 220, 224 and sum the signals at nodes B and D via capacitive elements 222, 226. Using capacitive summation removes (or at least reduces) systematic mismatch caused by conductivity modulation that may exist when using a resistive summing stage, as in conventional implementations.

Figure 2A:
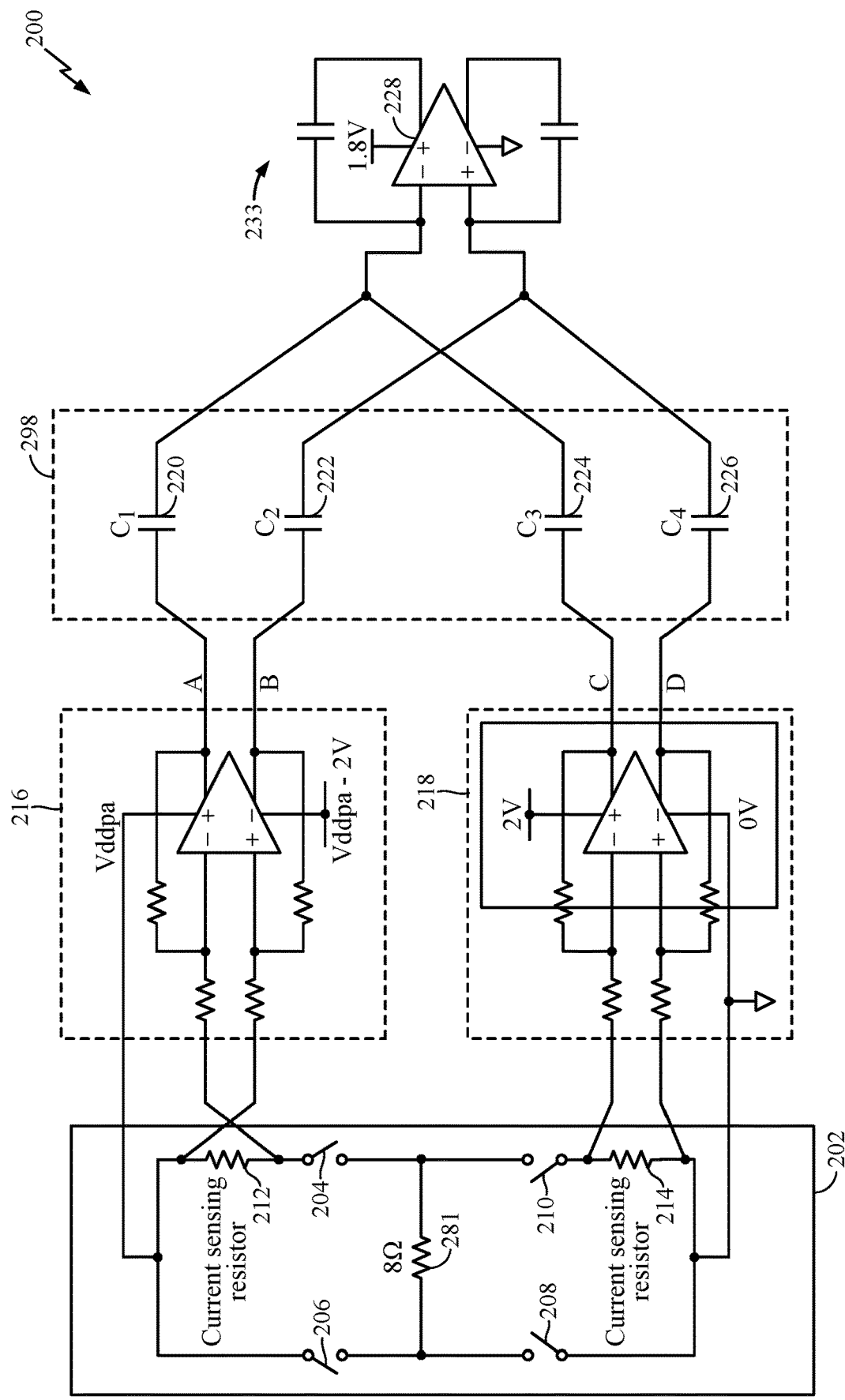
FIGS. 2A, 2B, 2C, and 2D illustrate current-sensing circuitry in accordance with certain aspects of the present disclosure.
Figure 2B:
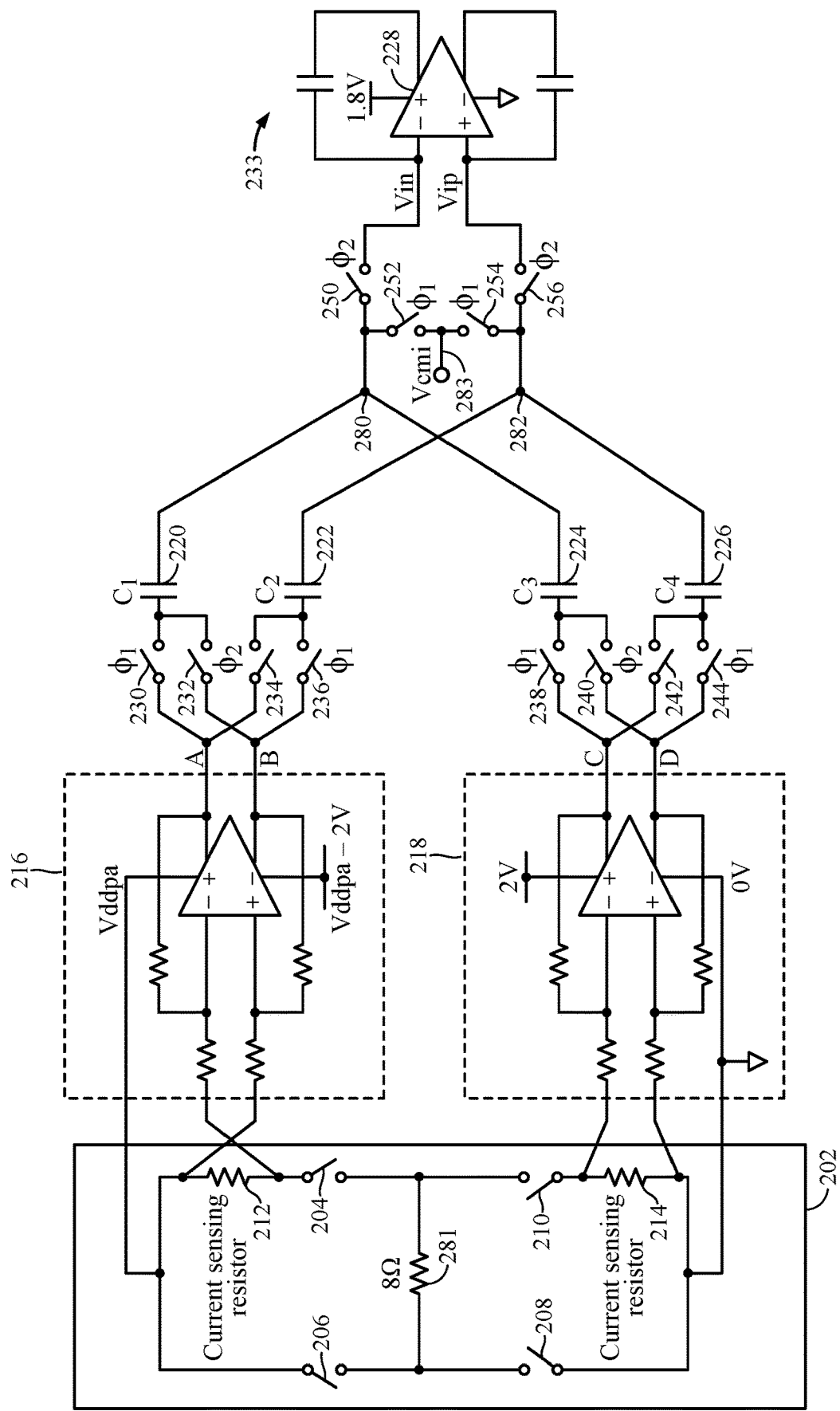

As illustrated in FIG. 2B, a double-sampling technique may be used to reject (or at least reduce) common-mode (CM) components (e.g., $V_{CM}$) at the output of the summing stage. For example, the voltage at node A ($V_A$) may be equal to $V_{CM}+V_{od}/2$, and the voltage at node B ($V_B$) may be equal to $V_{CM}-V_{od}/2$, where $V_{od}$ is the differential voltage between nodes A and B. The double-sampling network may be used to subtract a positive voltage sample at node A ($V_A$) from a voltage sample at node B ($V_B$), therefore eliminating (or at least reducing) $V_{CM}$. In this manner, the systematic CM-component-to-DM-component conversion in the summation stage may be reduced, increasing the accuracy of temperature predictions.

The double-sampling network may include switches 230, 234 configured to selectively couple node A to the capacitive elements 220, 222, switches 232, 236 configured to selectively couple node B to the capacitive elements 220, 222, switches 238, 242 configured to selectively couple node C to the capacitive elements 224, 226, and switches 240, 244 configured to selectively couple node D to the capacitive elements 224, 226. The sampling network may also include a switch 250 configured to selectively couple the capacitive elements 220, 224 to the negative input terminal (Vin node) of the amplifier 228, a switch 256 configured to selectively couple the capacitive elements 222, 226 to the positive input terminal (Vip node) of the amplifier 228. The sampling network also includes a switch 252 coupled between node 280 (also referred to herein as a common node) and a common-mode input voltage (Vcmi) node 283 and configured to selectively couple the capacitive elements 220, 224 to the Vcmi node 283. The sampling network also includes a switch 254 coupled between node 282 (also referred to herein as a common node) and the Vcmi node 283 and configured to selectively couple the capacitive elements 222, 226 to the Vcmi node 283.

During a first phase (φ1), the switches 230, 236, 238, 244, 252, 254 are closed, coupling capacitive elements 220, 222, 224, 226 between the Vcmi node 283 and respective nodes A, B, C, and D. The switches 232, 234, 240, 242, 250, 256 are open during φ1. Thus, during the first phase, capacitive elements 220, 224 are charged via the positive outputs of the respective amplifiers 216, 218 with respect to Vcmi, and the capacitive elements 222, 226 are discharged via the negative outputs of the respective amplifiers 216, 218 with respect to Vcmi. During the second phase (φ2), the switches 232, 234, 240, 242, 250, 256 are closed, coupling capacitive elements 220, 224 between the negative input terminal of the amplifier 228 and respective nodes B and D and coupling capacitive elements 222, 226 between the positive input terminal of the amplifier 228 and respective nodes A and C. The switches 230, 236, 238, 244, 252, 254 are open during φ2. Thus, during the second phase, capacitive elements 220, 224 are discharged via the negative outputs of respective amplifiers 216, 218, and the capacitive elements 222, 226 are charged via the positive outputs of respective amplifiers 216, 218. Thus, the sampling network in effect subtracts the voltages at nodes A and C from the voltages at nodes B and D, respectively, cancelling out (or at least reducing) the common-mode voltage component ($V_{CM}$).

Figure 2C:
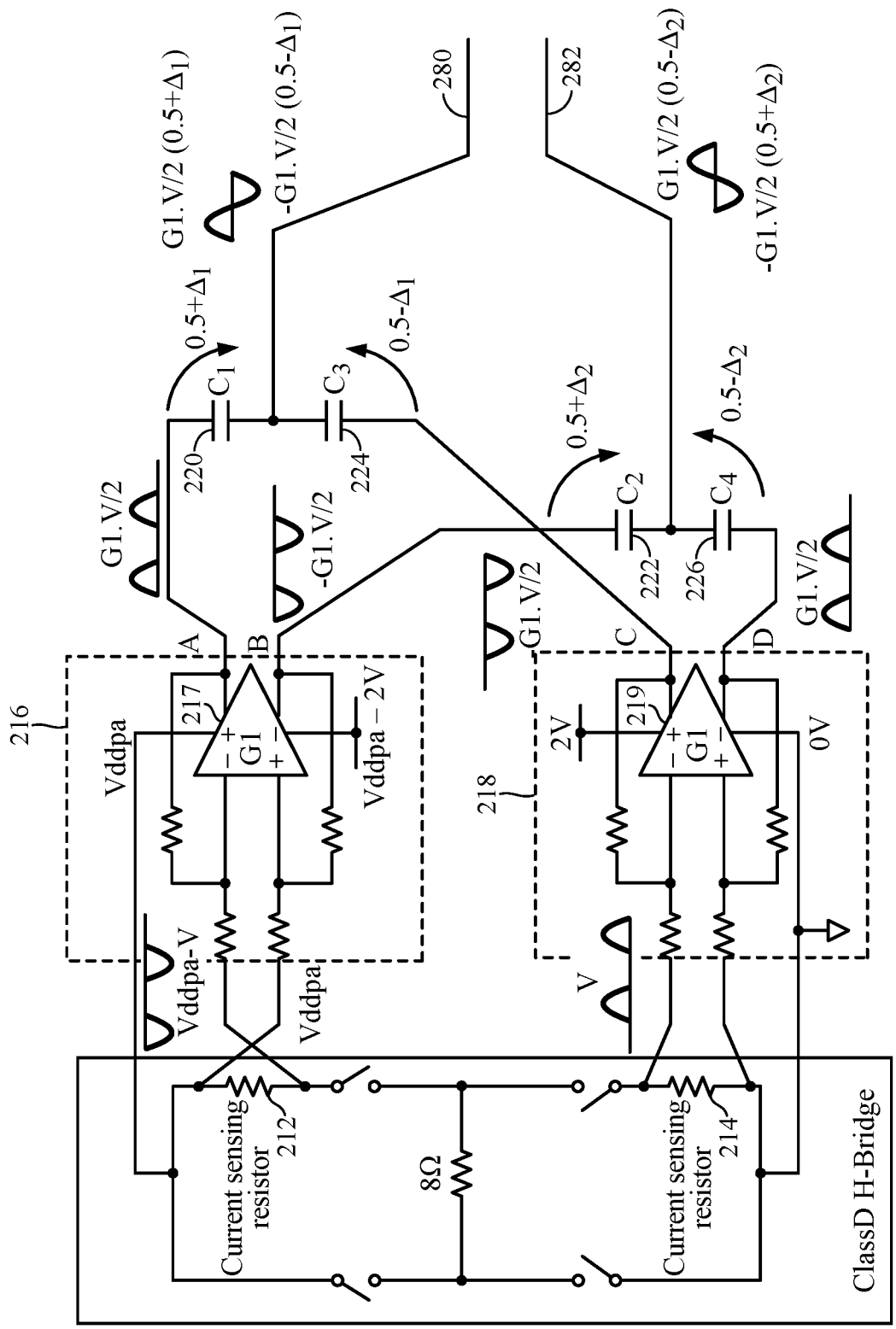

Certain aspects of the present disclosure are directed to eliminating (or at least reducing) the impact of random mismatch in the capacitance of the capacitive elements 220, 222, 224, 226 on THD. FIG. 2C illustrates the sampling network during the first phase described with respect to FIG. 2B. There may be a mismatch in the capacitances of the capacitive elements 220, 224 represented by 41, and a mismatch in the capacitances of the capacitive elements 222, 226 represented by 42. The current flow to nodes 280, 282 from the paths having respective capacitive elements 220, 226 may be represented by the expression:

$$\frac{G1 \times V}{2}$$

where G1 is the closed loop gain associated with the amplifier 216 (or the closed loop gain of the amplifier 218 when the closed loop gains of the amplifiers 216, 218 are equal), and V is the amplitude of the signal across the resistive element 212 (or resistive element 214, when the resistive elements 212, 214 are equal). Moreover, the current flow to nodes 280, 282 from the paths having respective capacitive elements 224, 222 may be represented by the expression:

$$\frac{-G1 \times V}{2}$$

The differential signal between nodes 280, 282 may have a positive peak given by the following equation:

$$\frac{G1 \times V}{2}(1 + \Delta 1 + \Delta 2)$$

and a negative peak given by the following equation:

$$\frac{-G1 \times V}{2}(1 - \Delta 1 - \Delta 2)$$

Therefore, the differential signal produces a distortion components if Δ1 is not made to be equal to −Δ2.

Since Δ1 and Δ2 are both random values and cannot be controlled, an averaging mechanism may be employed to force C1 and C4 to be effectively equal on average, and C3 and C2 to be effectively equal on average. This may be performed by rotating C1, C4 and C2, C3 every clock cycle, as described in more detail with respect to FIG. 2D. In other words, the averaging mechanism may involve: (1) setting the capacitance between node A and node 280 to be effectively equal, on average, to the capacitance between node D and node 282, and (2) setting the capacitance between node B and node 280 to be effectively equal, on average, to the capacitance between node C and node 282, which may be achieved using a sampling chopping structure as described in more detail with respect to FIG. 2D.

Figure 2D:
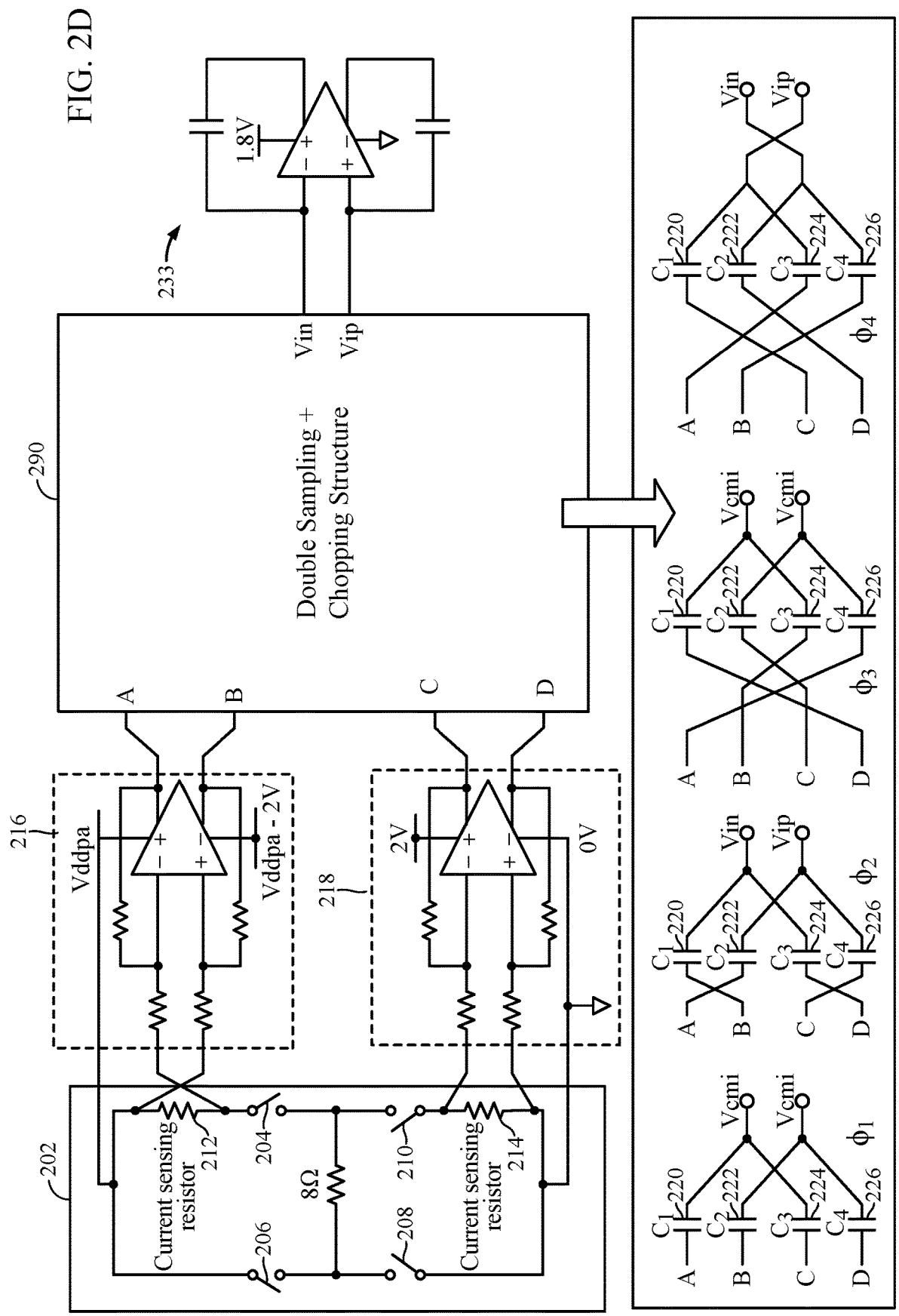

As illustrated in FIG. 2D, a sampling and chopping structure 290 may be implemented between the amplification stage 233 and the outputs of the amplifiers 216, 218 to reduce the impact of the random mismatch of the capacitive elements 220, 222, 224, 226 on THD. As illustrated, in addition to the first and second phases described with respect to FIG. 2B, a third phase (φ3) and a fourth phase (φ4) may be implemented.

As illustrated, during the third phase, the capacitive elements 220, 222 are coupled between Vcmi and respective nodes D and C, and the capacitive elements 224, 226 are coupled between Vcmi and respective nodes B and A. During the fourth phase, the capacitive elements 222, 226 are coupled between the negative input terminal (Vin) of the amplifier 228 and respective nodes D and B, and capacitive elements 220, 224 are coupled between the positive input terminal (Vip) of the amplifier 228 and respective nodes C and A. In other words, the third phase corresponds to the first phase, but with the signal paths through the capacitive elements 220, 222, 224, 226 in the first phase being switched with signal paths through the capacitive elements 226, 224, 222, 220 during the third phase, respectively. Moreover, the fourth phase corresponds to the second phase, but with the signal paths through the capacitive elements 220, 222, 224, 226 during the second phase being switched with signal paths through the capacitive elements 226, 224, 222, 220 during the fourth phase, respectively. In this manner, the impact of random mismatch in the capacitance of the capacitive elements 220, 222, 224, 226 on THD may be eliminated (or at least reduced).

Figure 3:
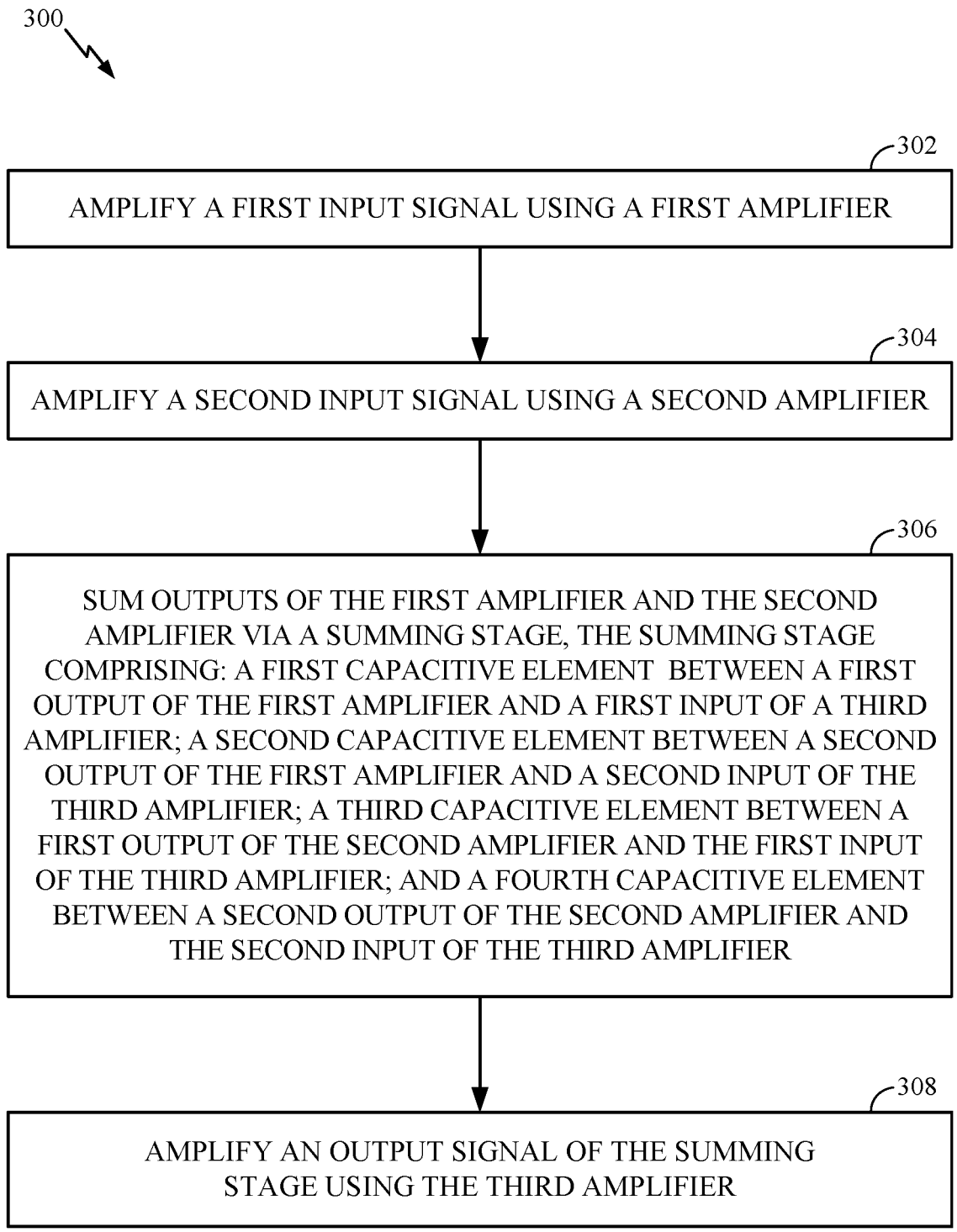
FIG. 3 is a flow diagram illustrating example operations for signal amplification, in accordance with certain aspects of the present disclosure.

FIG. 3 is a flow diagram illustrating example operations 300 for signal amplification, in accordance with certain aspects of the present disclosure. The operations 300 may be performed via circuitry, such as the current-sensing circuitry 200.

The operations 300 begin, at block 302, with the circuitry amplifying a first input signal (e.g., voltage across current-sensing resistive element 212) using a first amplifier (e.g., amplifier 216), and at block 304, amplifying a second input signal (e.g., voltage across current-sensing resistive element 214) using a second amplifier (e.g., amplifier 218). At block 306, the circuitry may sum outputs of the first amplifier and the second amplifier via a summing stage. In certain aspects, the summing stage may comprise a first capacitive element (e.g., capacitive element 220) between a first output (e.g., node B) of the first amplifier and a first input (e.g., Vin) of a third amplifier (e.g., amplifier 228), a second capacitive element (e.g., capacitive element 222) between a second output (e.g., node A) of the first amplifier and a second input (e.g., Vip) of the third amplifier, a third capacitive element (e.g., capacitive element 224) between a first output (e.g., node D) of the second amplifier and the first input of the third amplifier, and a fourth capacitive element (e.g., capacitive element 226) between a second output (e.g., node C) of the second amplifier and the second input of the third amplifier. At block 308, the circuitry amplifies an output signal of the summing stage using the third amplifier.

In certain aspects, the circuitry couples the first capacitive element (e.g., capacitive element 220) between the first output (e.g., node B) of the first amplifier and the first input (e.g., Vin) of a third amplifier (e.g., amplifier 228), couples the second capacitive element (e.g., capacitive element 222) between the second output (e.g., node A) of the first amplifier and the second input (e.g., Vip) of the third amplifier, couples the third capacitive element (e.g., capacitive element 224) between the first output (e.g., node D) of the second amplifier and the first input of the third amplifier, and couples the fourth capacitive element (e.g., capacitive element 226) between the second output (e.g., node C) of the second amplifier and the second input of the third amplifier.

In certain aspects, the circuitry may also couple the first capacitive element (e.g., capacitive element 220 between the second output (e.g., node A) of the first amplifier and a common-mode voltage node (e.g., Vcmi node) during a first phase (e.g., φ1), couple the second capacitive element (e.g. capacitive element 222) between the first output (e.g., node B) of the first amplifier and the common-mode voltage node during the first phase, couple the third capacitive element (e.g., capacitive element 224) between the second output (e.g., node C) of the second amplifier and the common-mode voltage node during the first phase, and couple the fourth capacitive element (e.g., capacitive element 226) between the first output (e.g., node D) of the second amplifier and the common-mode voltage node during the first phase. In certain aspects, the first capacitive element is coupled between the first output of the first amplifier and the first input of the third amplifier during a second phase (e.g., φ2), the second capacitive element is coupled between the second output of the first amplifier and the second input of the third amplifier during the second phase, the third capacitive element is coupled between the first output of the second amplifier and the first input of the third amplifier during the second phase, and the fourth capacitive element is coupled between the second output of the second amplifier and the second input of the third amplifier during the second phase. In other words, the operations at blocks 306, 308, 310, and 312 may occur during the second phase.

In certain aspects, the circuitry may also couple the first capacitive element between the first output (e.g., node D) of the second amplifier and the common-mode voltage node during a third phase (e.g., φ3), couple the second capacitive element between the second output (e.g., node C) of the second amplifier and the common-mode voltage node during the third phase, couple the third capacitive element between the first output (e.g., node B) of the first amplifier and the common-mode voltage node during the third phase, and couple the fourth capacitive element between the second output (e.g., node A) of the first amplifier and the common-mode voltage node during the third phase. The circuitry may also couple the first capacitive element between the second output (e.g., node C) of the second amplifier and the second input (e.g., Vip node) of the third amplifier during a fourth phase (e.g., φ4), couple the second capacitive element between the first output (e.g., node D) of the second amplifier and the first input (e.g., Vin node) of the third amplifier during the fourth phase, couple the third capacitive element between the second output (e.g., node A) of the first amplifier and the second input (e.g., Vip node) of the third amplifier during the fourth phase, and couple the fourth capacitive element between the first output (e.g., node B) of the first amplifier and the first input (e.g., Vin node) of the third amplifier during the fourth phase. In certain aspects, the second phase follows the first phase, the third phase follows the second phase, and the fourth phase follows the third phase.

Aspects of the present disclosure may take the form of an entirely hardware implementation, or an implementation combining software and hardware aspects that may all generally be referred to herein as a "circuit," "module," or "system." The present disclosure may be a system, a method, and/or a computer program product. The computer program product may include a computer-readable storage medium (or media) having computer-readable program instructions thereon for causing a processor to carry out aspects of the present disclosure.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network (LAN), a wide area network (WAN), and/or a wireless network. The network may comprise copper transmission cables, optical transmission fibers, wireless transmission, routers, firewalls, switches, gateway computers, and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine-dependent instructions, microcode, firmware instructions, state-setting data, or either source code or object code written in any combination of one or more programming languages, including an object oriented programming language such as Smalltalk, C++, or the like, and conventional procedural programming languages, such as the "C" programming language or similar programming languages. The computer-readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a LAN or a WAN, or the connection may be made to an external computer (for example, through the Internet using an Internet Service Provider (ISP)). In some examples, electronic circuitry including, for example, programmable logic circuitry, field-programmable gate arrays (FPGAs), or programmable logic arrays (PLAs) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to examples of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks. In certain aspects, means for amplifying may comprise an amplifier, such as the amplifier 216, 218, or 228. In certain aspects, means for (selectively) coupling may comprise a switch, such as the switches 230, 232, 234, 236, 238, 240, 242, 244, 250, 252, 254, 256, and/or a controller, such as the DSP 102.

The computer-readable program instructions may also be loaded onto a computer, other programmable data processing apparatus, or other device to cause a series of operational steps to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various examples of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to examples of the present disclosure, other and further examples of the disclosure may be devised without departing from the basic scope thereof, and the scope thereof is determined by the claims that follow.

What is claimed is:

1. A circuit for signal amplification, comprising:
a first amplifier;
a second amplifier;
a third amplifier;
a first capacitive element coupled between a first output of the first amplifier and a first input of the third amplifier;
a second capacitive element coupled between a second output of the first amplifier and a second input of the third amplifier;
a third capacitive element coupled between a first output of the second amplifier and the first input of the third amplifier;
a fourth capacitive element coupled between a second output of the second amplifier and the second input of the third amplifier; and
a first switch coupled between the first output of the first amplifier and the first capacitive element.

2. The circuit of claim 1, further comprising:
a second switch coupled between the second output of the first amplifier and the second capacitive element;
a third switch coupled between the first output of the second amplifier and the third capacitive element; and
a fourth switch coupled between the second output of the second amplifier and the fourth capacitive element.

3. The circuit of claim 2, further comprising:
a fifth switch coupled between the second output of the first amplifier and the first capacitive element;
a sixth switch coupled between the first output of the first amplifier and the second capacitive element;
a seventh switch coupled between the second output of the second amplifier and the third capacitive element; and
an eighth switch coupled between the first output of the second amplifier and the fourth capacitive element.

4. The circuit of claim 3, further comprising:
a ninth switch coupled between a common-mode voltage node and a first common node of the circuit, the first capacitive element and the third capacitive element being coupled to the first common node;
a tenth switch coupled between the common-mode voltage node and a second common node of the circuit, the second capacitive element and the fourth capacitive element being coupled to the second common node;
an eleventh switch coupled between the first common node and the first input of the third amplifier; and
a twelfth switch coupled between the second common node and the second input of the third amplifier.

5. The circuit of claim 4, wherein:
the fifth switch, the sixth switch, the seventh switch, the eighth switch, the ninth switch, and the tenth switch are configured to be closed during a first phase;
the first switch, the second switch, the third switch, the fourth switch, the eleventh switch, and the twelfth switch are configured to be open during the first phase;
the first switch, the second switch, the third switch, the fourth switch, the eleventh switch, and the twelfth switch are configured to be closed during a second phase; and
the fifth switch, the sixth switch, the seventh switch, the eighth switch, the ninth switch, and the tenth switch are configured to be open during the second phase.

6. The circuit of claim 1, wherein:
the first amplifier is configured to amplify a voltage across a first current-sensing resistive element; and
the second amplifier is configured to amplify a voltage across a second current-sensing resistive element.

7. The circuit of claim 6, wherein:
the first current-sensing resistive element is coupled in series with a first switch of an H-bridge amplifier; and
the second current-sensing resistive element is coupled in series with a second switch of the H-bridge amplifier.

8. The circuit of claim 1, wherein each of the first amplifier and the second amplifier is configured as a differential amplifier.

9. A method for signal amplification, comprising:
amplifying a first input signal using a first amplifier;
amplifying a second input signal using a second amplifier;
summing outputs of the first amplifier and the second amplifier via a summing stage, the summing stage comprising:
a first capacitive element between a first output of the first amplifier and a first input of a third amplifier;
a second capacitive element between a second output of the first amplifier and a second input of the third amplifier;
a third capacitive element between a first output of the second amplifier and the first input of the third amplifier; and
a fourth capacitive element between a second output of the second amplifier and the second input of the third amplifier;
coupling the first capacitive element between the second output of the first amplifier and a common-mode voltage node during a first phase; and
amplifying an output signal of the summing stage using the third amplifier.

10. The method of claim 9, further comprising:
coupling the first capacitive element between the first output of the first amplifier and the first input of the third amplifier;
coupling the second capacitive element between the second output of the first amplifier and the second input of the third amplifier;
coupling the third capacitive element between the first output of the second amplifier and the first input of the third amplifier; and
coupling the fourth capacitive element between the second output of the second amplifier and the second input of the third amplifier.

11. The method of claim 10, further comprising:
coupling the second capacitive element between the first output of the first amplifier and the common-mode voltage node during the first phase;
coupling the third capacitive element between the second output of the second amplifier and the common-mode voltage node during the first phase; and
coupling the fourth capacitive element between the first output of the second amplifier and the common-mode voltage node during the first phase, wherein the first capacitive element is coupled between the first output of the first amplifier and the first input of the third amplifier during a second phase, the second capacitive element is coupled between the second output of the first amplifier and the second input of the third amplifier during the second phase, the third capacitive element is coupled between the first output of the second amplifier and the first input of the third amplifier during the second phase, and the fourth capacitive element is coupled between the second output of the second amplifier and the second input of the third amplifier during the second phase.

12. The method of claim 11, further comprising:
coupling the first capacitive element between the first output of the second amplifier and the common-mode voltage node during a third phase;
coupling the second capacitive element between the second output of the second amplifier and the common-mode voltage node during the third phase;
coupling the third capacitive element between the first output of the first amplifier and the common-mode voltage node during the third phase; and
coupling the fourth capacitive element between the second output of the first amplifier and the common-mode voltage node during the third phase.

13. The method of claim 12, further comprising:
coupling the first capacitive element between the second output of the second amplifier and the second input of the third amplifier during a fourth phase;
coupling the second capacitive element between the first output of the second amplifier and the first input of the third amplifier during the fourth phase;
coupling the third capacitive element between the second output of the first amplifier and the second input of the third amplifier during the fourth phase; and
coupling the fourth capacitive element between the first output of the first amplifier and the first input of the third amplifier during the fourth phase.

14. A circuit for signal amplification, comprising:
a first amplifier;
a second amplifier;
a third amplifier;
a first capacitive element coupled between a first output of the first amplifier and a first input of the third amplifier;
a second capacitive element coupled between a second output of the first amplifier and a second input of the third amplifier;
a third capacitive element coupled between a first output of the second amplifier and the first input of the third amplifier;
a fourth capacitive element coupled between a second output of the second amplifier and the second input of the third amplifier; and
a sampling network configured to couple the first capacitive element between the second output of the first amplifier and a common-mode voltage node during a first phase.

15. The circuit of claim 14, wherein:
the first amplifier is configured to amplify a voltage across a first current-sensing resistive element; and
the second amplifier is configured to amplify a voltage across a second current-sensing resistive element.

16. The circuit of claim 15, wherein:
the first current-sensing resistive element is coupled in series with a first switch of an H-bridge amplifier; and
the second current-sensing resistive element is coupled in series with a second switch of the H-bridge amplifier.

17. The circuit of claim 14, further comprising a wherein the sampling network is further configured to:
couple the second capacitive element between the first output of the first amplifier and the common-mode voltage node during the first phase;
couple the third capacitive element between the second output of the second amplifier and the common-mode voltage node during the first phase; and
couple the fourth capacitive element between the first output of the second amplifier and the common-mode voltage node during the first phase.

18. The circuit of claim 17, wherein the sampling network is further configured to:
couple the first capacitive element between the first output of the first amplifier and the first input of the third amplifier during a second phase;
couple the second capacitive element between the second output of the first amplifier and the second input of the third amplifier during the second phase;
couple the third capacitive element between the first output of the second amplifier and the first input of the third amplifier during the second phase; and
couple the fourth capacitive element between the second output of the second amplifier and the second input of the third amplifier during the second phase.

19. The circuit of claim 18, wherein the sampling network is further configured to:
couple the first capacitive element between the first output of the second amplifier and the common-mode voltage node during a third phase;
couple the second capacitive element between the second output of the second amplifier and the common-mode voltage node during the third phase;
couple the third capacitive element between the first output of the first amplifier and the common-mode voltage node during the third phase; and
couple the fourth capacitive element between the second output of the first amplifier and the common-mode voltage node during the third phase.

20. The circuit of claim 19, wherein the sampling network is further configured to:
couple the first capacitive element between the second output of the second amplifier and the second input of the third amplifier during a fourth phase;
couple the second capacitive element between the first output of the second amplifier and the first input of the third amplifier during the fourth phase;
couple the third capacitive element between the second output of the first amplifier and the second input of the third amplifier during the fourth phase; and
couple the fourth capacitive element between the first output of the first amplifier and the first input of the third amplifier during the fourth phase.

* * * * *